(12) United States Patent
Yamada

(10) Patent No.: US 7,253,463 B2
(45) Date of Patent: Aug. 7, 2007

(54) SEMICONDUCTOR MEMORY DEVICE AND METHOD OF MANUFACTURING THE SAME

(75) Inventor: Yuki Yamada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/066,162

(22) Filed: Feb. 28, 2005

(65) Prior Publication Data

US 2006/0054948 A1  Mar. 16, 2006

(30) Foreign Application Priority Data

Sep. 15, 2004  (JP) ............................. 2004-268694

(51) Int. Cl.
*H01L 29/76* (2006.01)
(52) U.S. Cl. ............... 257/295; 257/303; 257/306; 257/310; 257/E27.104; 257/E29.343
(58) Field of Classification Search ................ 257/303, 257/306, 310, 295, E27.104, E29.343
See application file for complete search history.

(56) References Cited

U.S. PATENT DOCUMENTS

| 5,227,855 | A | | 7/1993 | Momose | |
| 5,382,817 | A | * | 1/1995 | Kashihara et al. | ........... 257/295 |
| 5,506,748 | A | | 4/1996 | Hoshiba | |
| 6,249,014 | B1 | * | 6/2001 | Bailey | .................... 257/295 |
| 6,541,281 | B2 | * | 4/2003 | Ramesh | ........................ 438/3 |
| 6,548,343 | B1 | | 4/2003 | Summerfelt et al. | |
| 6,677,636 | B2 | * | 1/2004 | Deboer et al. | ............... 257/306 |
| 2002/0019123 | A1 | * | 2/2002 | Ma et al. | ..................... 438/622 |
| 2002/0197856 | A1 | * | 12/2002 | Matsuse et al. | ............. 438/652 |
| 2005/0145908 | A1 | * | 7/2005 | Moise et al. | ................. 257/295 |

FOREIGN PATENT DOCUMENTS

| JP | 5-67792 | 3/1993 |
| JP | 2000-286393 | 10/2000 |
| JP | 2001-244426 | 9/2001 |

* cited by examiner

*Primary Examiner*—Jerome Jackson
*Assistant Examiner*—José R. Díaz
(74) *Attorney, Agent, or Firm*—Oblon, Spivak, McClelland, Maier & Neustadt, P.C.

(57) ABSTRACT

A semiconductor memory device includes a semi-conductor substrate, a MOS transistor formed on the semiconductor substrate and including a pair of impurity regions as a source and a drain, and a gate electrode, a first conductive plug formed in contact with an upper surface of one of the pair of impurity regions, and a planar ferroelectric capacitor formed by stacking a lower electrode layer, a ferroelectric layer and an upper electrode layer on the first conductive plug, a side face upper end of the first conductive plug being aligned with a corresponding part of a side face of the ferroelectric capacitor.

10 Claims, 13 Drawing Sheets

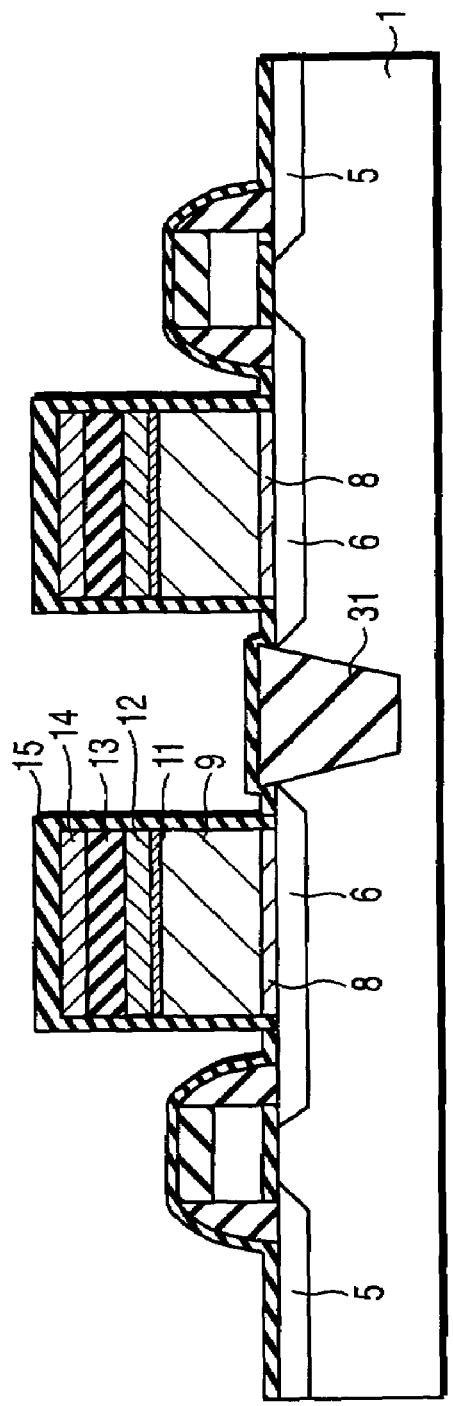
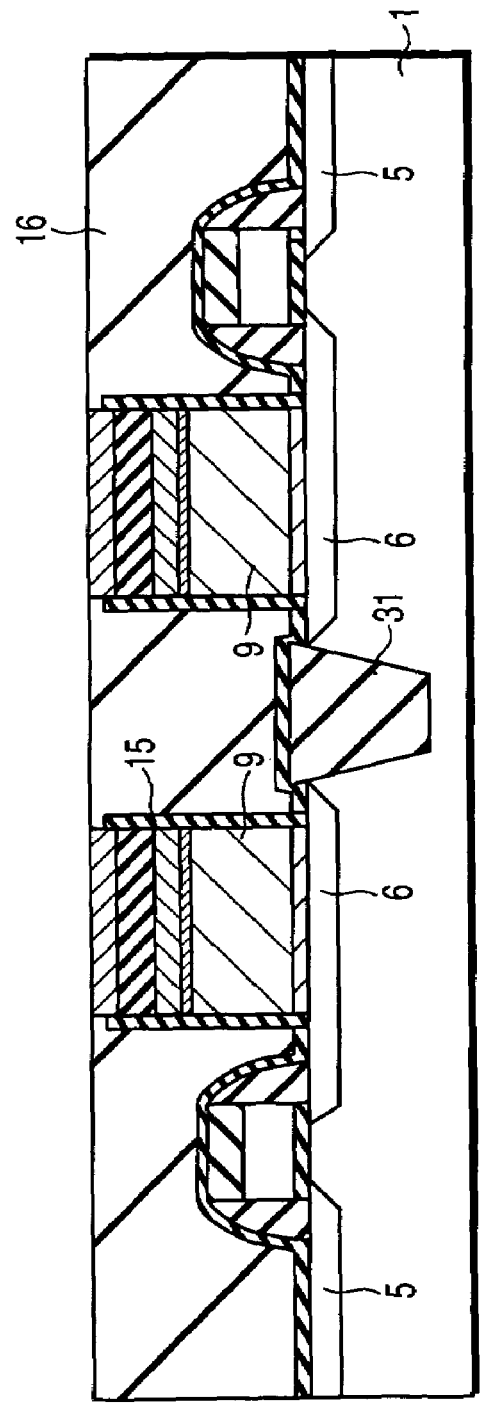

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-268694, filed Sep. 15, 2004, the entire contents of which are incorporated herein by reference.

BACKGROUND OF THE INVENTION

1. Field of the Invention

The present invention relates to a semiconductor memory device which comprises a ferroelectric capacitor, and more particularly to a semiconductor memory device which comprises a highly integrated ferroelectric memory cell array and a method of manufacturing the same.

2. Description of the Related Art

Recent popularization of portable type devices has been accompanied by frequent use of nonvolatile memories from which no stored contents are lost even when power is cut off. In addition to a flash memory or SRAM, one such nonvolatile memory is a ferroelectric memory (FeRAM) which preserves data in a ferroelectric capacitor.

For example, a ferroelectric memory is disclosed in Jpn. Pat. Appln. KOKAI Publication No. 2001-244426. The ferroelectric capacitor of the document is a so-called capacitor-on-plug (COP) type capacitor as shown in FIG. 1 of the Publication. A plug is formed on one of the source and drain regions of a MOSFET which is a memory transistor, and then the ferroelectric capacitor is formed thereon.

In the case of forming the FeRAM of the afore-mentioned constitution, the following-problems may occur. First, independent processes are necessary for plug formation and capacitor formation. Second, an alignment margin is necessary between the plug and the capacitor. Because of the necessity of such a lithography margin, a limit inevitably occurs in high integration. Third, contact resistance easily becomes high due to oxidation on the contact surface between the plug and the lower electrode of the capacitor.

Thus, there has been a demand for a ferroelectric memory which can achieve high integration by minimizing the lithography margin which is necessary to form a plug and capacitor and reduce contact resistance of the plug.

BRIEF SUMMARY OF THE INVENTION

According to a first aspect of the invention, there is provided a semiconductor memory device which comprises:
  a semiconductor substrate;
  a MOS transistor formed on the semiconductor substrate and including a pair of impurity regions as a source and a drain, and a gate electrode;
  a first conductive plug formed in contact with an upper surface of one of the pair of impurity regions; and
  a planar ferroelectric capacitor formed by stacking a lower electrode layer, a ferroelectric layer and an upper electrode layer on the first conductive plug, a side face upper end of the first conductive plug being aligned with a corresponding part of a side face of the ferroelectric capacitor.

According to a second aspect of the invention, there is provided a method of manufacturing a semiconductor memory device, which comprises:
  forming a MOS transistor on a semiconductor substrate;
  forming a first reaction preventive film to cover the semiconductor substrate and the MOS transistor;
  forming a first conductive film through the first reaction preventive layer on the semiconductor substrate to bury the MOS transistor;
  planarizing a surface of the first conductive film;
  sequentially stacking a second reaction preventive film, a lower electrode film, a ferroelectric film and an upper electrode film on the first conductive film to form a ferroelectric capacitor laminated structure; and
  simultaneously forming a ferroelectric capacitor and a first conductive plug by processing the ferroelectric laminated structure using a single mask.

According to a third aspect of the invention, there is provided a method of manufacturing a semiconductor memory device, which comprises:
  forming a MOS transistor on a semiconductor substrate;
  forming a first protective insulating film to cover the semiconductor substrate and the MOS transistor;
  opening a part of the first protective insulating film to expose one of source and drain regions of the MOS transistor, and forming a first contact portion;
  depositing a first reaction preventive film;
  forming a first conductive film on the first reaction preventive film;
  sequentially forming a second reaction preventive film, a lower electrode film, a ferroelectric film and an upper electrode film from bottom up on the first conductive film to form a ferroelectric capacitor laminated structure; and
  simultaneously forming a ferroelectric capacitor and a conductive plug by processing the ferroelectric laminated structure and the first conductive film using a single mask.

BRIEF DESCRIPTION OF THE SEVERAL VIEWS OF THE DRAWING

FIGS. 2 to 8 are sectional views showing a method of manufacturing the semiconductor memory device of the first embodiment in stages;

DETAILED DESCRIPTION OF THE INVENTION

Next, the embodiments of the present invention will be described with reference to the accompanying drawings.

FIRST EMBODIMENT

Figure 1A:
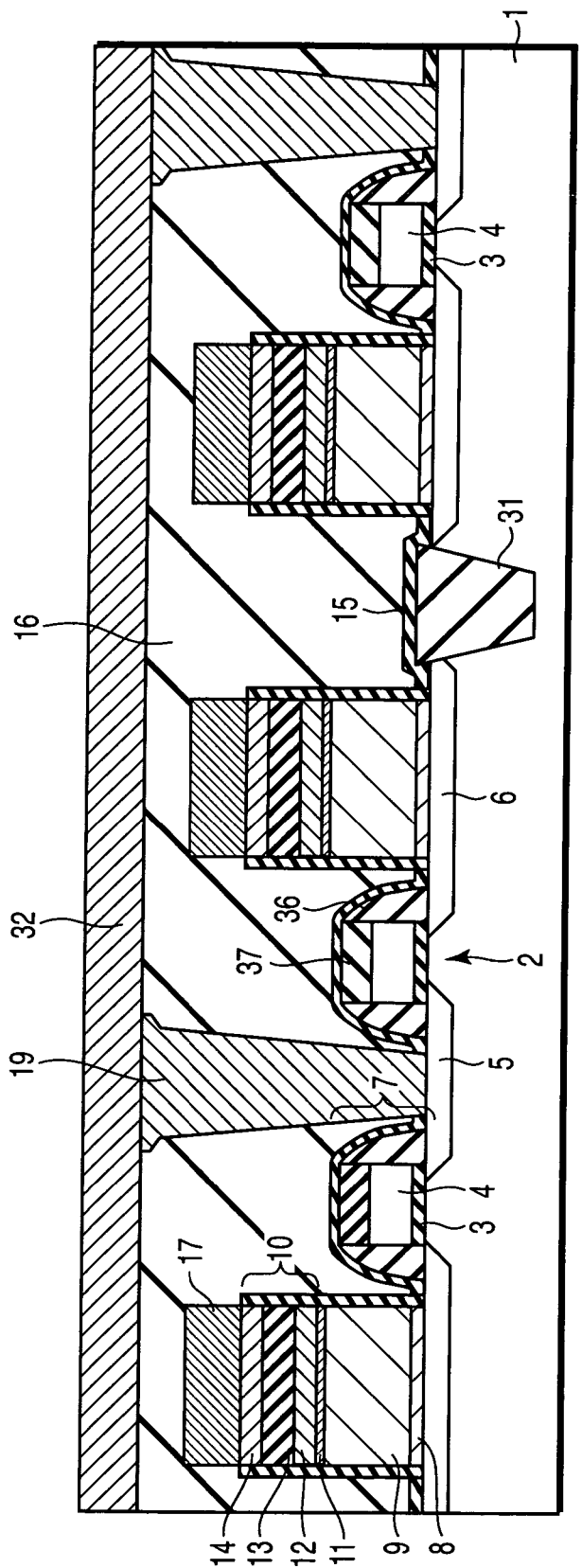
FIGS. 1A and 1B are a partial sectional view and an equivalent circuit diagram showing a semiconductor memory device according to a first embodiment.
Figure 1B:
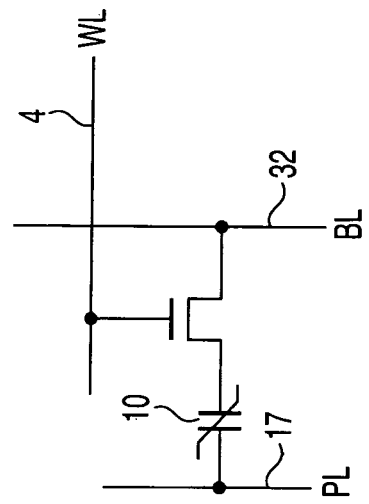

FIG. 1A is a partial sectional view showing a semiconductor memory device according to a first embodiment of the invention, and FIG. 1B is an equivalent circuit diagram of one memory cell which constitutes the semiconductor memory device. In FIG. 1A, a pair of source and drain regions 5, 6 which are impurity diffusion regions are formed in a device region 2 of an upper surface of a semiconductor substrate 1. A gate electrode 4 is formed through a gate insulating film 3 on the device region held between the source and drain regions 5, 6. The gate electrode 4 becomes a word line. A reference numeral 36 denotes a gate sidewall insulating film, and 37 a gate upper part insulating film. A plurality of such memory cell transistors 7 are formed on the device region 2.

To make a pair with the memory cell transistor 7, a conductive contact plug 9 and a capacitor 10 aligned therewith are formed on the source/drain region 6. The capacitor 10 comprises an upper electrode 14, a lower electrode 12, and a ferroelectric film 13 held therebetween. The upper electrode 14 and the lower electrode 12 are connected to a plate line 17 and the source/drain region 6. The source/drain region 6 is connected through a contact plug 19 to a bit line 32. The reference numeral 31 denotes a shallow trench isolation (STI).

This structure is realized by continuously processing the capacitor 10 and the contact plug 9 using one mask. Thus, processing can be simplified, and a highly integrated memory cell can be formed since it is not necessary to consider a lithography margin between the contact plug 9 and the capacitor 10.

Figure 2:
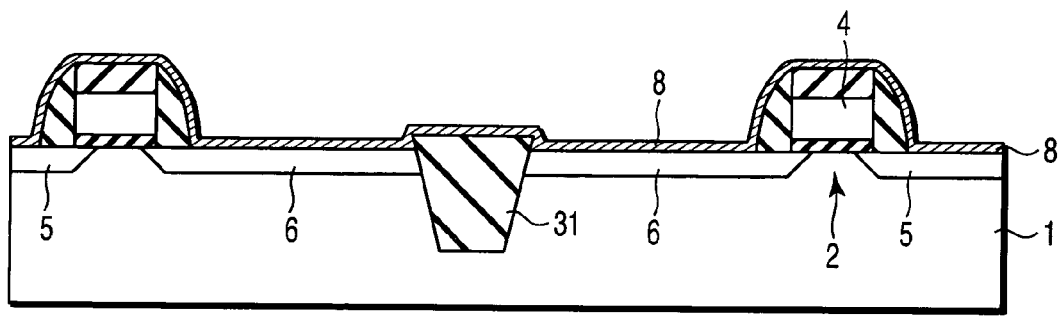

Next, referring to FIGS. 2 to 8, a method of manufacturing the semiconductor memory device of the embodiment will be described. First, as shown in FIG. 2, a device isolation region 31, source and drain regions 5, 6, a gate insulating film 3, and a gate electrode 4 made of, e.g., polysilicon, are formed on a device region 2 of a semiconductor substrate 1 made of, e.g., Si by a well-known method.

Figure 3:
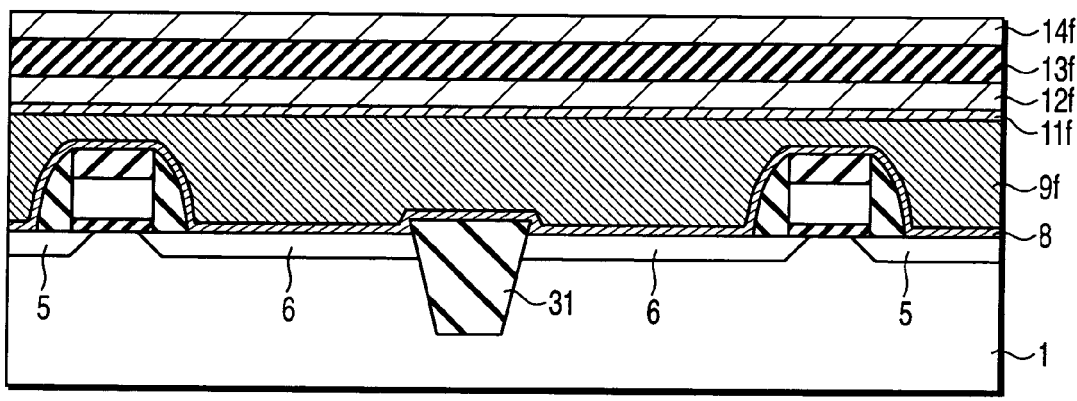

Subsequently, as shown in FIG. 3, a first reaction preventive film 8 and a first contact plug film (conductive film) 9*f* are formed by a sputtering method or a CVD method. For example, a conductive film of Ti, TiN or the like can be used for the first reaction preventive film, and a conductive film or the like of W, Poly-Si or the like can be used for the first contact plug film. The first reaction preventive film 8 is used to prevent diffusion of a metal constituting a first contact plug through the source and drain regions 5, 6. After the first reaction preventive film 8 and the first contact plug film (conductive film) 9*f* are deposited, surfaces thereof are planarized by a CMP method or the like.

Subsequently, to constitute a capacitor unit 10, a second reaction preventive film 11, a lower electrode film 12*f*, a ferroelectric film 13*f* and an upper electrode film 14*f* are sequentially formed on the contact plug film 9*f*. As materials for the upper and lower electrodes, for example, Pt, $IrO_2$, or strontium ruthenium oxide (SRO) can be used. For the ferroelectric film, for example, $Pb(Zr, Ti)O_3$ (PZT), $SrBi_2Ta_2O_9$ (SBT) or the like can be used. The second reaction preventive film 11 is inserted for the purpose of preventing oxygen diffusion, and a conductive film of Ir, $IrO_2$, TiAlN or the like can be used as a material.

Next, as shown in FIG. 4, the upper electrode film 14*f*, the ferroelectric film 13*f*, the lower electrode film 12*f*, the second reaction preventive film 11 and the contact plug film 9*f* are continuously processed by using one mask, whereby an upper electrode 14, a ferroelectric film 13, a lower electrode film 12 and a contact plug 9 are formed all at once. For the processing of the capacitor/contact portion, for example, reactive ion etching (RIE) using a reactive gas ArCl, $CF_4$ or the like can be used.

Subsequently, a third reaction preventive film 15 is deposited. The third reaction preventive film 15 can optimize film type, film thickness or the like according to the process. For example, the third reaction preventive film is constituted of a single layer, and an oxygen barrier property or a hydrogen barrier property, or both are provided, whereby the device can be protected from oxygen or hydrogen which it encounters in the process. The third reaction preventive film may be constituted of a plurality of layers and, for example, a film of an oxygen barrier property may be deposited before a film of a hydrogen barrier film. With this constitution, it is possible to prevent more surely deterioration of capacitor characteristics caused by hydrogen generated in the process after the formation of the capacitor. As a material for the film of the hydrogen barrier property, SiN or the like is available, and $Al_2O_3$ or the like is available as a material which has both oxygen and hydrogen barrier properties.

Subsequently, as shown in FIG. 5, as a first interlayer insulating film 16, for example, a BPSG film or a TEOS film (DTEOS film) is deposited by CVD, and then the film is planarized by a CMP method or the like to expose the upper electrode 14. When necessary, recovery annealing (oxygen annealing) may be included to recover the characteristics of the capacitor 10.

Figure 6:
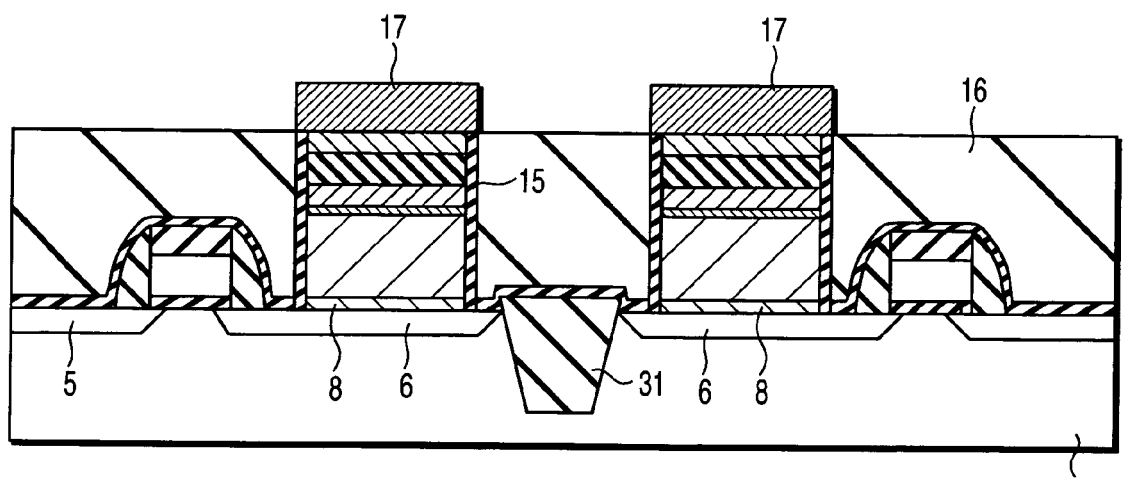
Figure 7:
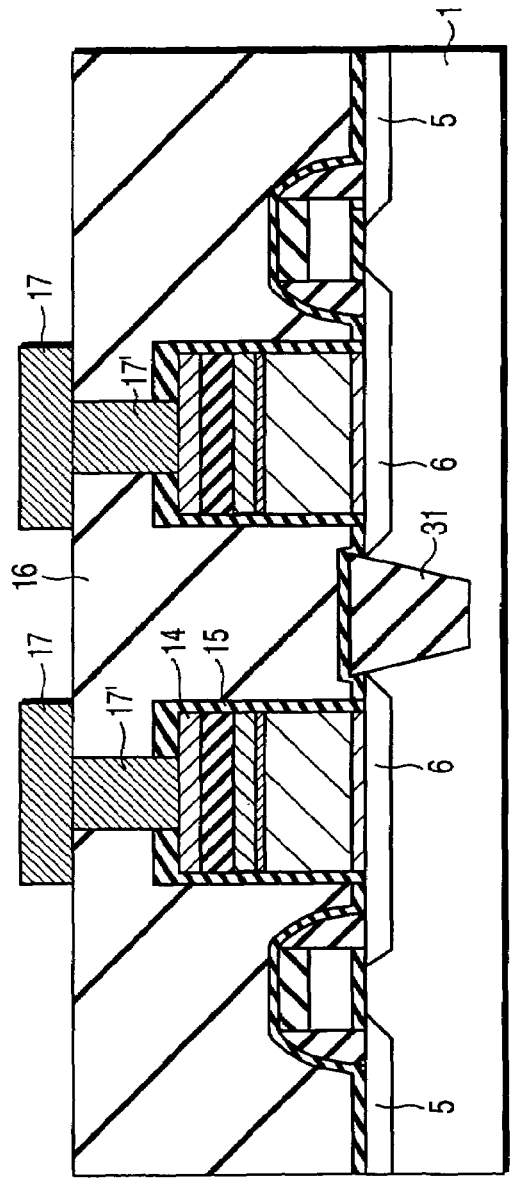

Next, as shown in FIG. 6, as a first metal film 17, a plate line 17 is formed by using RIE or the like after, e.g., an Al-based metal or Cu is deposited, and a second interlayer insulating film (not shown) is deposited thereon. For the second interlayer insulating film, a material similar to that of the first interlayer insulating film 16 can be used, and integrated therewith after the deposition. Thus, the second interlayer insulating film is shown as the first interlayer insulating film 16 in drawings (FIG. 6) thereafter.

Figure 17:
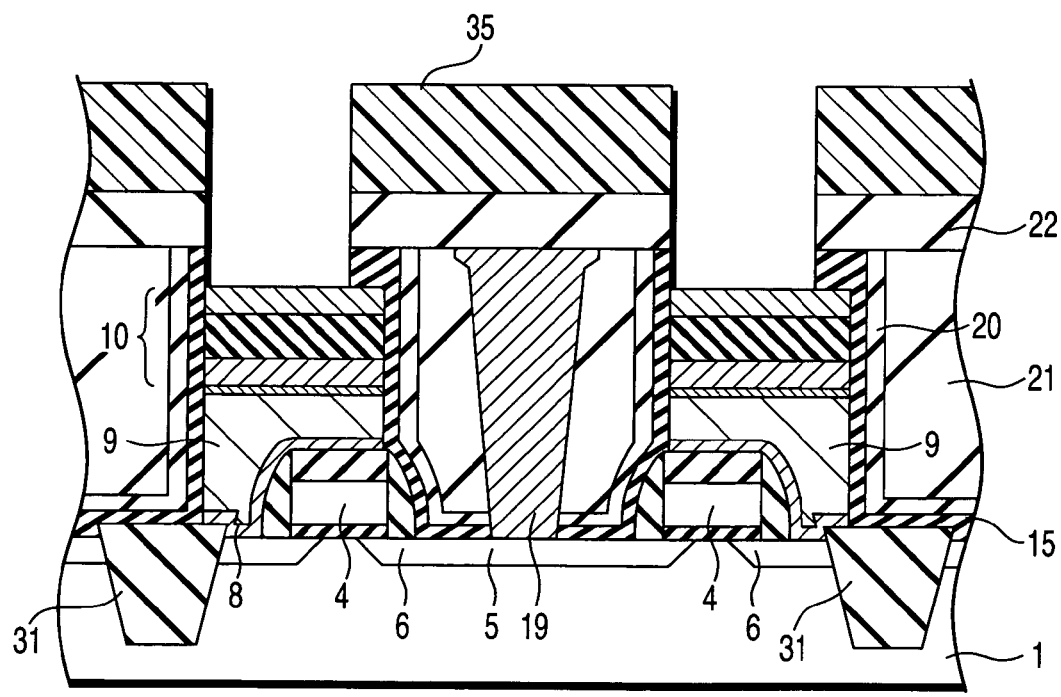

The method of directly forming the plate line 17 on the upper electrode 14 has been described. However, the upper electrode 14 can be covered with the first interlayer insulating film 16, a contact hole can be formed therein, and the upper electrode 14 can be connected through a contact plug to the plate line. In this case, as shown in FIG. 17, the upper electrode is not exposed during the planarization of the first interlayer insulating film 16, and a contact hole is formed on the upper electrode 14. Accordingly, a structure can be realized in which the plate line 17 is connected through a plate line contact plug 17' to the upper electrode 14.

Each of the other embodiments (described later) only shows a method of forming a plate line of a contact hole as in the case of FIG. 6. However, in each of second, fourth and fifth embodiments, a structure can be employed in which a plate line is similar to that of a modified embodiment shown in FIG. 7.

Figure 8:
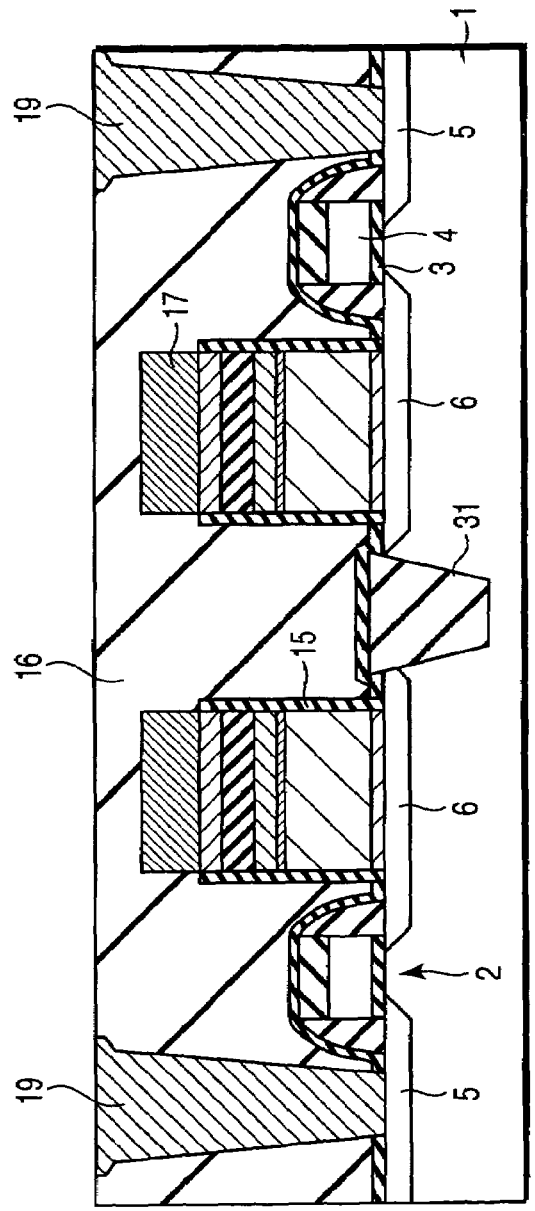

Subsequently, as shown in FIG. 8, a contact hole for a bit line contact 19 is formed in the first interlayer insulating film 16, the bit line contact 19 is formed, and a bit line 32 is formed by using, e.g., an Al metal or Cu after a surface thereof is planarized, whereby a structure shown in FIG. 1A is completed. Incidentally, the example of forming the bit line contact 19 and the bit line 32 in the two steps has been described. However, these components may be simultaneously formed in a single step.

As described above, according to the first embodiment, the contact plug and the ferroelectric capacitor aligned therewith can be formed all at once on the source or drain region of the memory transistor (MOSFET) by using a single mask. With this structure, it is possible to realize high integration of the cells while there is an alignment margin, and to simultaneously reduce contact resistance by increasing the contact area between the lower electrode and the contact plug immediately below.

Furthermore, in the case of directly forming the plate line on the upper electrode of the capacitor without using any contact holes, it is possible to shorten the process. The third reaction preventive film 15 of a single layer or a plurality of layers is formed to continuously cover the side faces of the capacitor 10 and the contact plug 9. However, by providing an oxygen barrier property, a hydrogen barrier property, or both to the third reaction preventive film, it is possible to prevent deterioration of the ferroelectric capacitor by suppressing oxidation of the first contact plug.

SECOND EMBODIMENT

Figure 9:
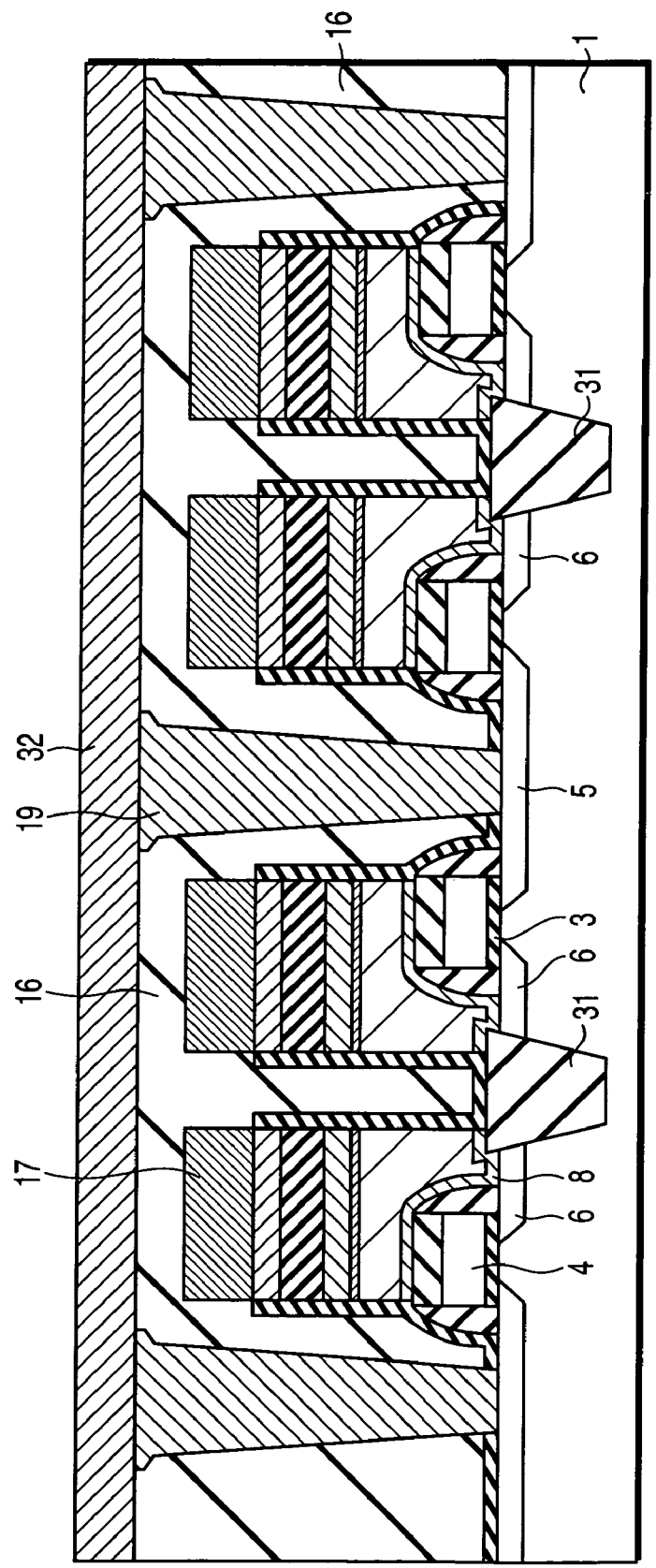
FIG. 9 is a partial sectional view showing a semiconductor memory device according to a second embodiment.
Figure 10:
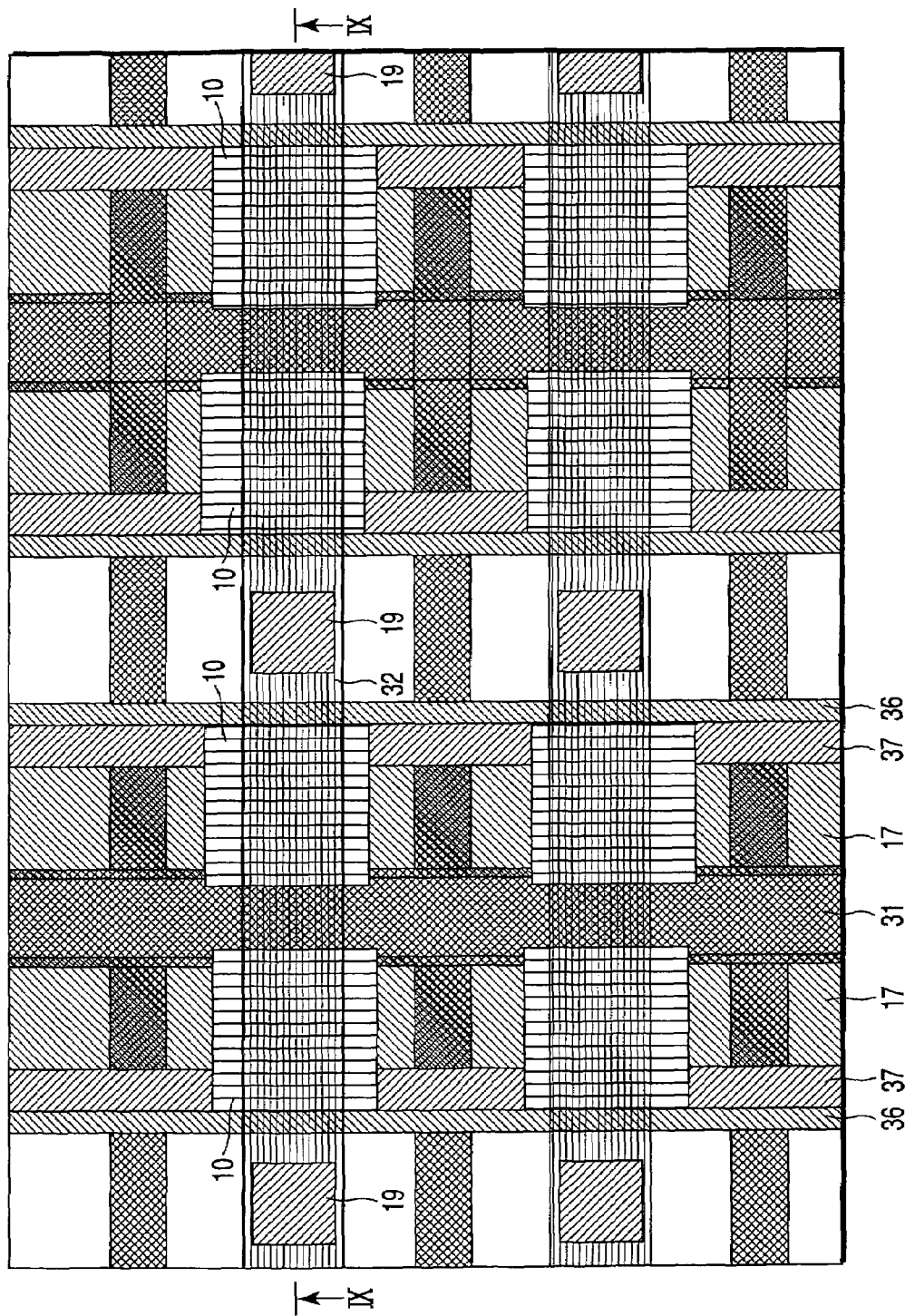
FIG. 10 is a schematic plan view showing the semiconductor memory device of the second embodiment.

FIGS. 9 and 10 are a partial sectional view of a semiconductor memory device according to a second embodiment, and a schematic plan view on which a mask drawing is superimposed. FIG. 9 shows a section along the IX-IX line of FIG. 10. According to the second embodiment, a contact plug 9 and a capacitor unit 10 are formed in positions to overlap a gate electrode 4. As in the previous case, the capacitor unit 10 is aligned with the contact plug 9, and formed by using one mask. The manufacturing process is basically similar to that of the first embodiment. In FIG. 3, after the formation of the upper electrode film 14f, the capacitor 10 and the contact plug 9 are continuously formed in positions to overlap the gate electrode 4 by using one mask. Other aspects are similar to those of the first embodiment, and thus repeated explanation will be avoided.

Figure 11:
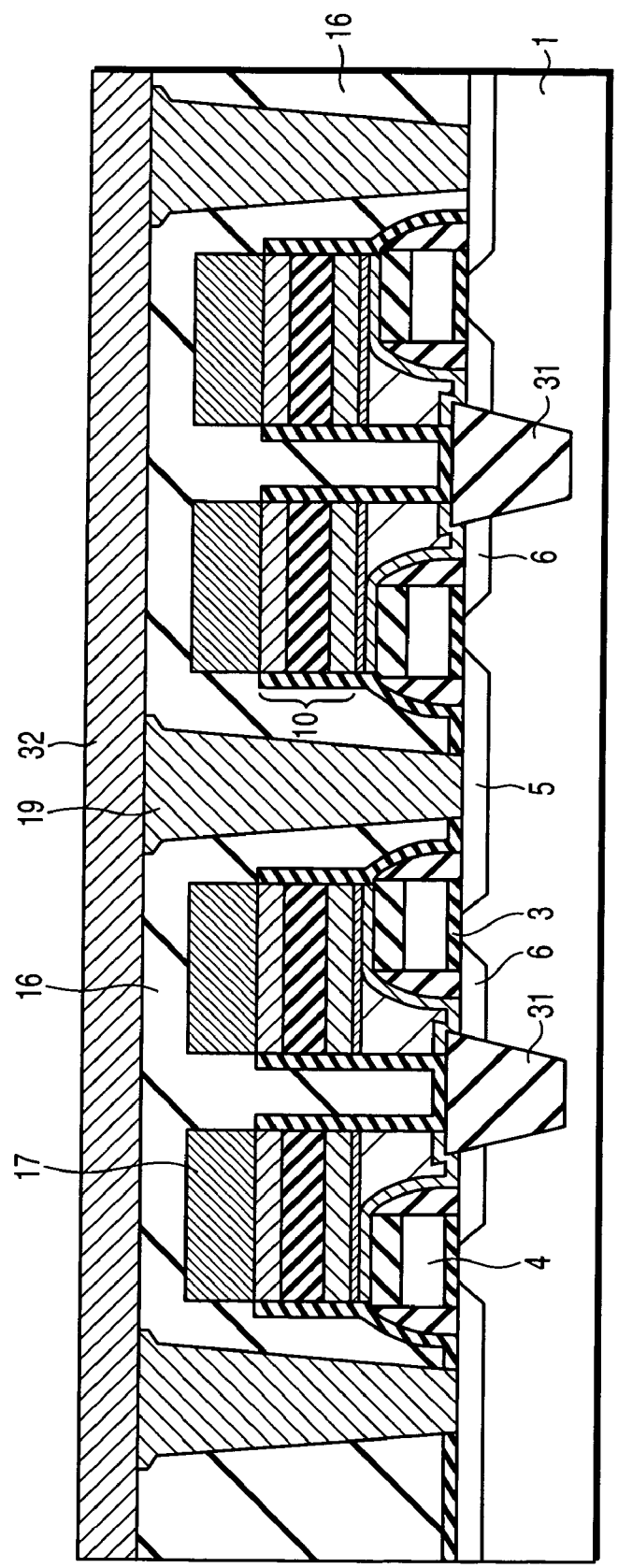
FIG. 11 is a sectional view showing a state in which an upper area of a plug electrode becomes minimum according to the second embodiment.

FIG. 11 is a sectional view of a semiconductor memory device according to a modified embodiment of the second embodiment. The upper surface of a contact plug of FIG. 11 is flush with the upper surface of a first reaction preventive film 8. This can be realized in a manner that when the upper surface is planarized by CMP after the deposition of the contact plug film 9f in FIG. 3, the CMP is cancelled at a point in time when the first reaction preventive film 8 is exposed. According to the modified embodiment, while the contact area between the contact plug 9 and the capacitor 10 is slightly reduced, this structure can be employed if such is permitted.

By employing the aforementioned structure, it is possible to further increase the capacitor area while maintaining the advantages of the first embodiment, or much higher integration can be realized even when the capacitor area is not changed.

THIRD EMBODIMENT

Figure 12:
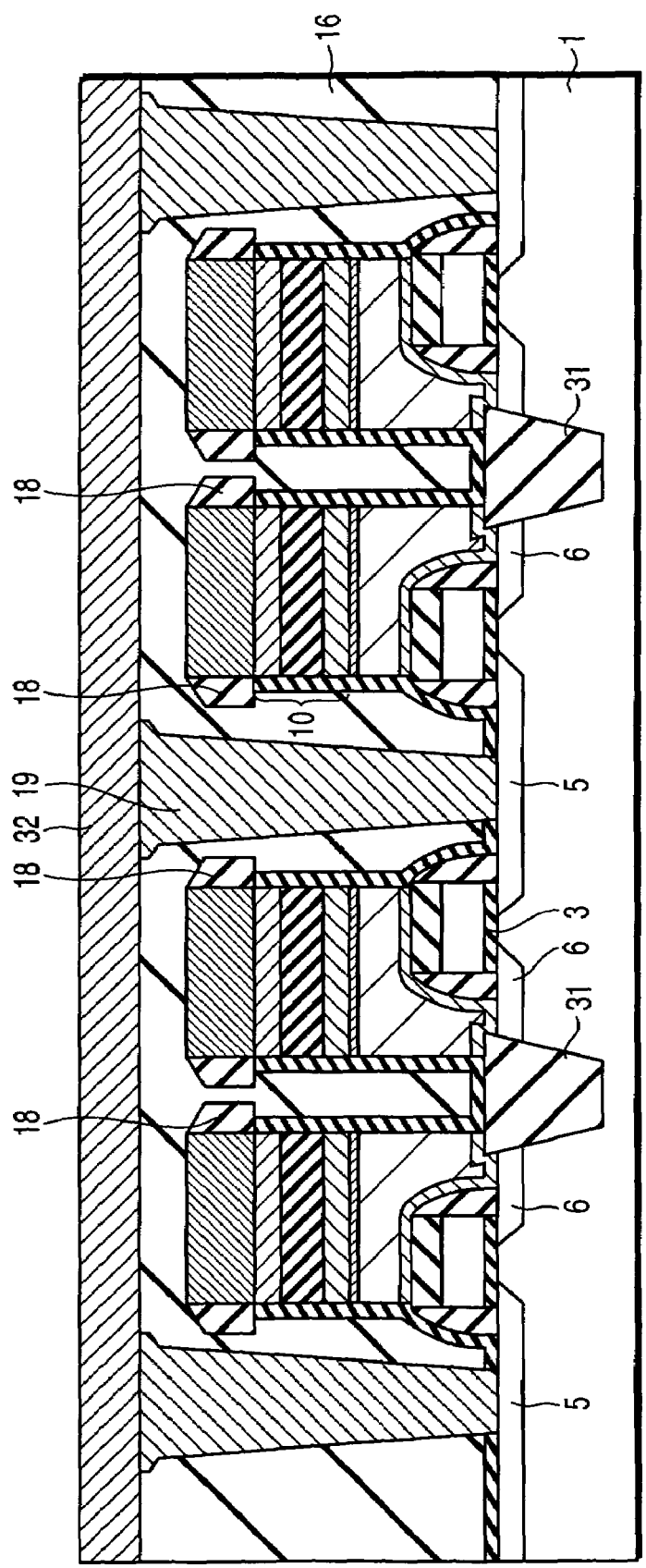
FIG. 12 is a partial sectional view showing a semiconductor memory device according to a third embodiment.

FIG. 12 is a partial sectional view showing a semiconductor memory device according to a third embodiment. According to the third embodiment, a sidewall insulating film 18 is formed in a sidewall part of a plate line 17 on a capacitor 10 by using, e.g., SiN. This can be formed by depositing, after the end of the process of the first embodiment of FIG. 6, SiN on a full surface, executing anisotropic etching such as RIE, and leaving the SiN on a side face of the plate line 17.

By employing this structure, even when shifting occurs in alignment of the plate line 17, it is possible to prevent exposure of the upper electrode 14 of the capacitor 10, and to prevent short-circuiting between the contact plug 19 and the plate line 17 and between adjacent two of the plate lines 17. FIG. 12 shows a capacitor structure similar to that of the second embodiment (FIG. 9). Features of the third embodiment can be applied to the first embodiment (FIG. 1A) and a fifth embodiment (described later).

FOURTH EMBODIMENT

Figure 13:
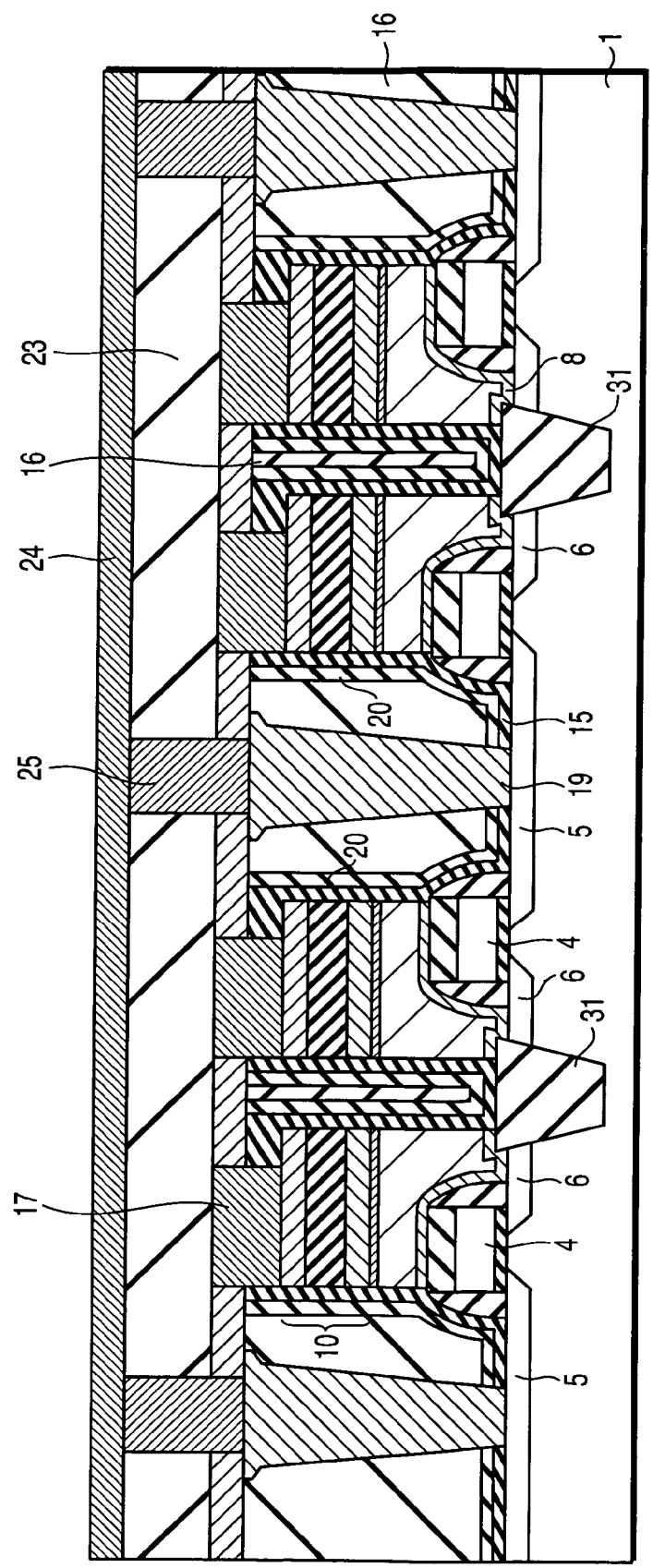
FIG. 13 is a partial sectional view showing a semiconductor memory device according to a fourth embodiment.

FIG. 13 is a partial sectional view showing a semiconductor memory device according to a fourth embodiment. According to the fourth embodiment, a contact of a bit line 24 is formed in a manner of connecting two plugs 25, 19, and a contact plug 19 of a first stage is formed before formation of a plate line 17.

By employing such a structure, it is possible to lower the aspect ratio of the contact plugs 25, 19 to connect the bit line 24 to a source/drain region 5. Additionally, since recovery annealing (oxygen annealing) can be executed after formation of the contact plug 19 which generates hydrogen, capacitor characteristics can be improved.

Figure 14:
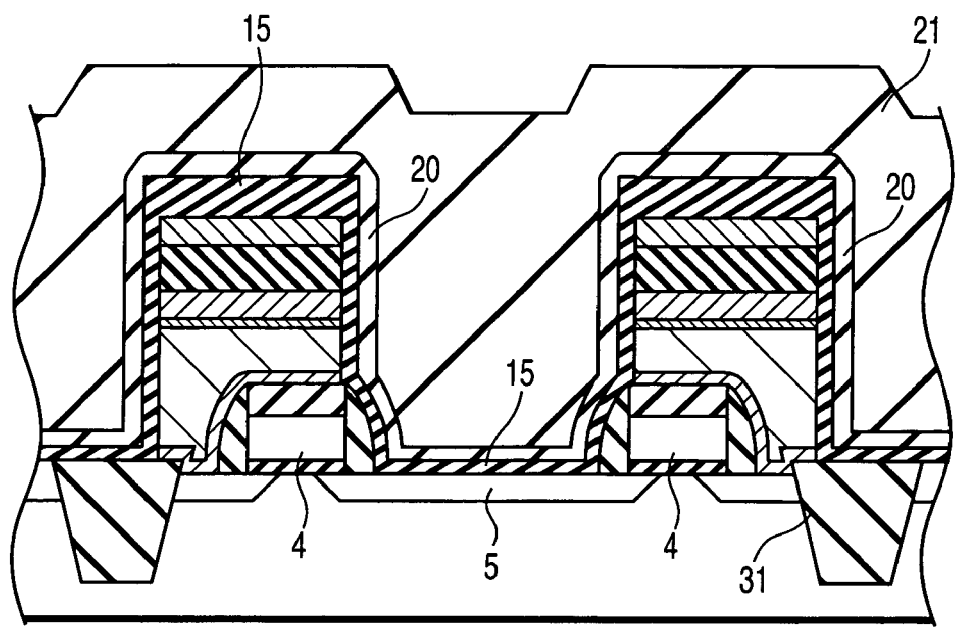
FIGS. 14 to 19 are sectional views stepwise showing a method of manufacturing the semiconductor memory device of the fourth embodiment.

Referring to FIGS. 14 to 19, a manufacturing method of the fourth embodiment will be described. FIGS. 14 to 19 only show the center of FIG. 13 to simplify the drawings. The process up to the integral formation of a capacitor 10 and a contact 9 is similar to that of the first or second embodiment, and thus description thereof will be omitted. After the formation of the capacitor 10 and the contact plug 9 and formation of a third reaction preventive film 15 are finished as shown in FIG. 4, as shown in FIG. 14, a sidewall insulating film 20 of the capacitor 10 and the contact plug 9 is formed by using, e.g., SiN, and a second interlayer insulating film 21 is deposited by using, e.g., a BNPSG film or a DTEOS film. Subsequently, the second interlayer insulating film 21 is planarized by using a CMP method until the upper surface of the third reaction preventive film 15 is exposed.

Figure 15:
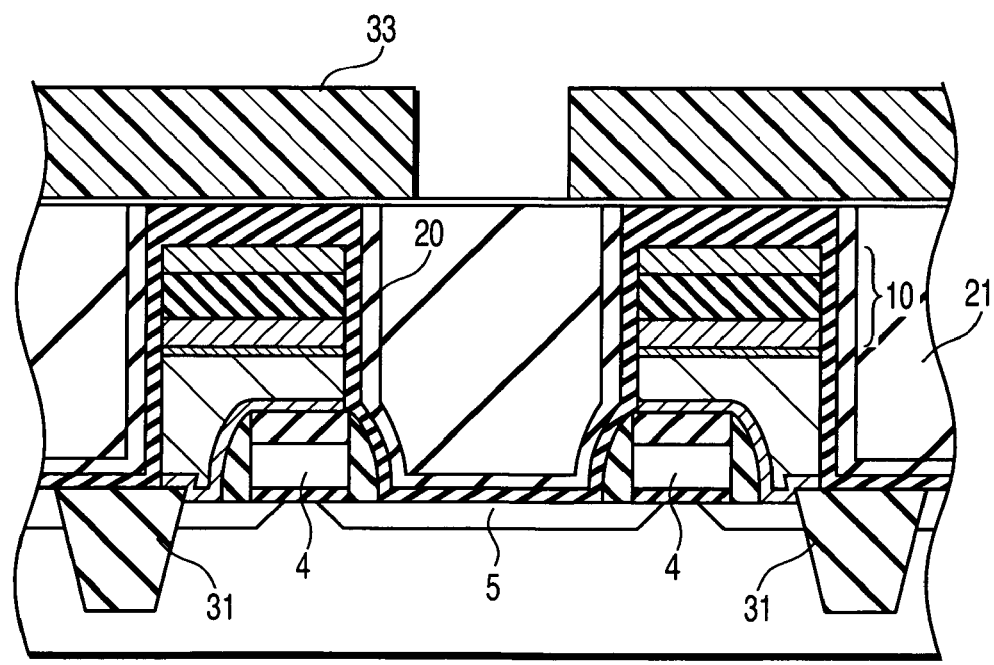

Next, as shown in FIG. 15, a photoresist mask 33 is formed, and a contact hole (not shown) is processed in an opening thereof by using an RIE method. A W, Al or Cu plug film (not shown) for the contact plug 19 is buried in the contact hole, and then its upper surface is planarized. In this case, it is possible to further improve CMP accuracy by adjusting residual films of the sidewall insulating film 20 and the third reaction preventive film 15 on the upper electrode to be left during the planarization of the interlayer insulating film 21, and causing the residual films to function as CMP stoppers at the time of planarizing the contact plug 19.

Figure 16:
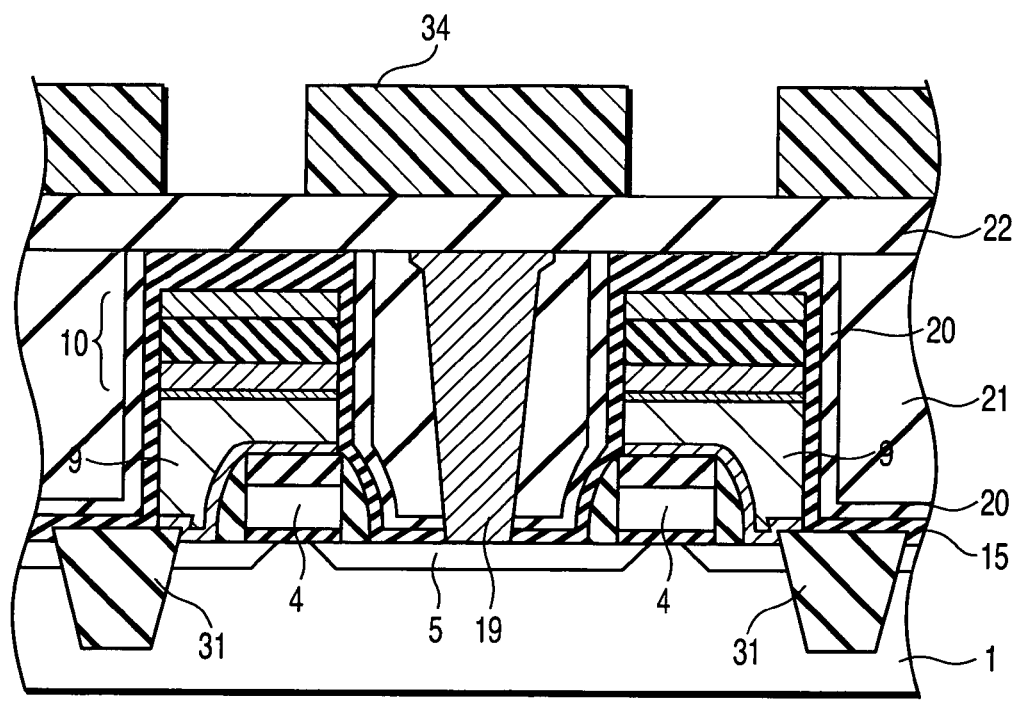

After the planarization of the contact plug 19, as shown in FIG. 16, an oxygen barrier film 22 (e.g., $Al_2O_3$ film) is deposited, and a photoresist mask 34 is formed thereon. A trench is processed to bury a bit line by using the mask 34 as shown in FIG. 17. If necessary, it is possible to recover capacitor characteristics by executing recovery annealing (oxygen annealing) after the trench is formed. In this case, since the contact plug 19 is covered with the oxygen barrier film 22, it is possible to prevent oxidation of the contact surface.

Figure 18:
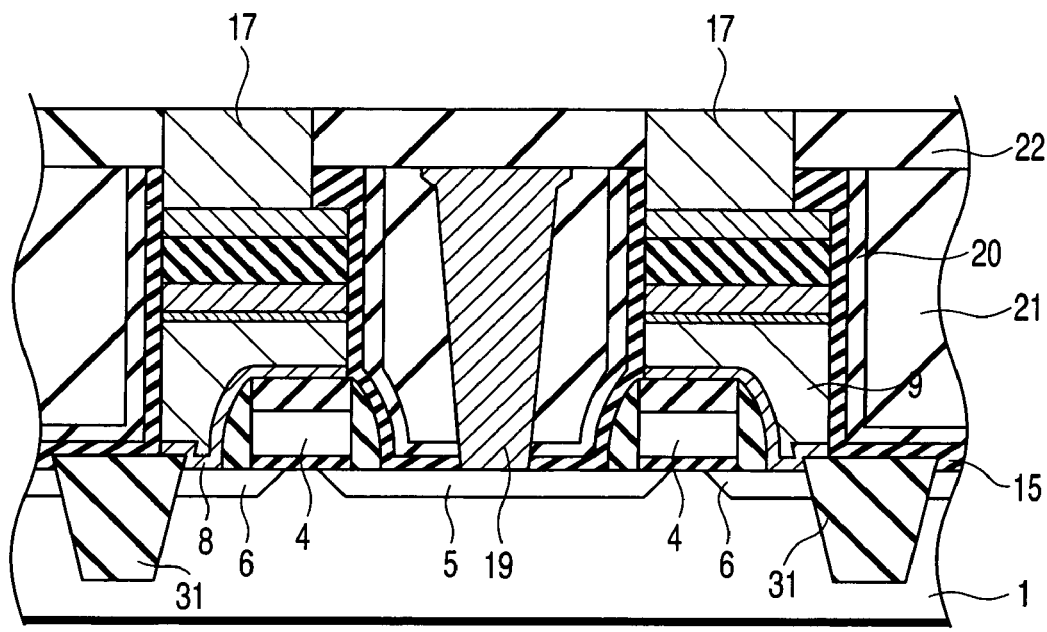
Figure 19:
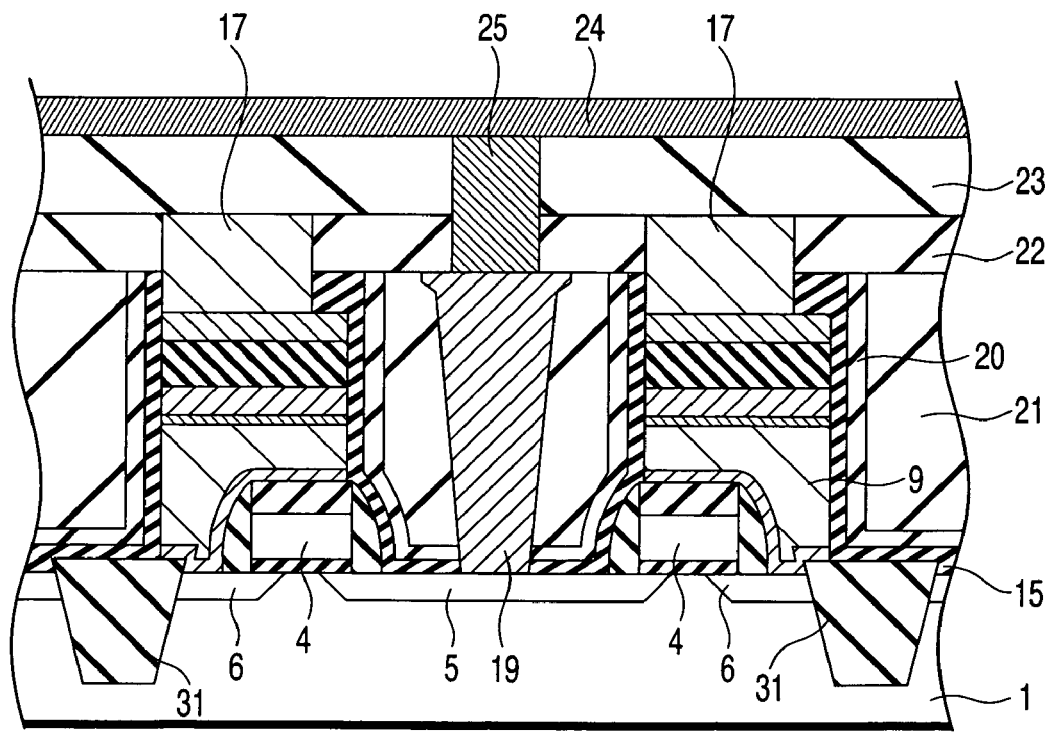

Next, as shown in FIG. 18, a metal (e.g., Al-based metal or Cu) for a plate line is buried, and planarization is executed by CMP to form a plate line 17. Subsequently, as shown in FIG. 19, a third interlayer insulating film 23 (e.g., BPSG film or DTEOS film) is deposited, and a bit line 24 and a third contact plug 25 are formed by using an Al-based metal, Cu or the like, whereby a structure of the fourth embodiment can be realized.

By employing the aforementioned structure, it is possible to prevent oxidation of the contact plug 19 during the oxygen annealing step.

FIFTH EMBODIMENT

Figure 20:
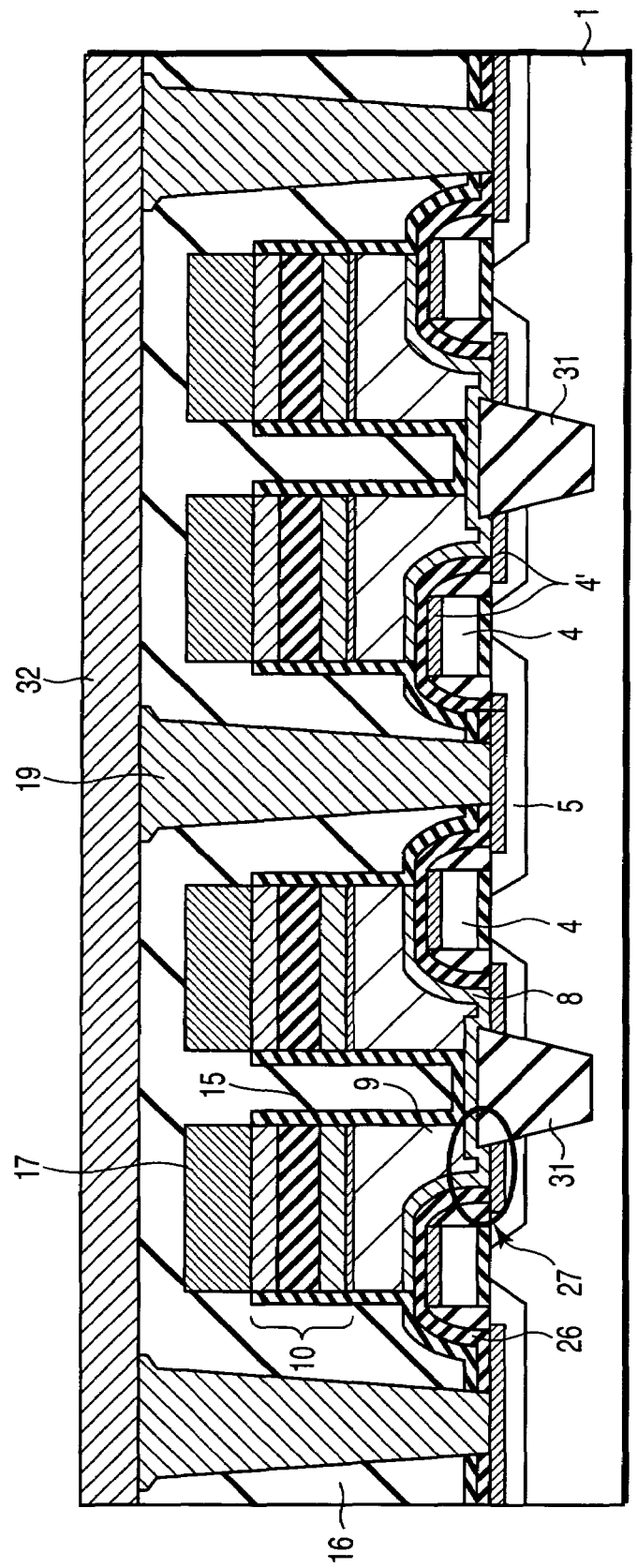
FIG. 20 is a partial sectional view showing a semiconductor memory device according to a fifth embodiment.

FIG. 20 is a partial sectional view of a semiconductor memory device according to a fifth embodiment. According to the fifth embodiment, a first protective film 26 made of, e.g., SiN, is deposited to cover the gate electrode 4 of a MOS transistor in which a salicide film (compound film of silicon and metal formed in self-alignment) 4' has been formed. Subsequently, after formation of an opening as a contact 27 for source and drain regions 5, 6, a first reaction preventive film 8 and a first contact plug 9 are deposited. In this case, since the aspect ratio of the plug 9 of the contact 27 can be suppressed, and the gate electrode having the salicide film can be used without losing the advantage of forming the plug 9 and a capacitor 10 in alignment, the capacitor structure of the embodiment can be applied to a transistor which needs a salicide process. Incidentally, as a capacitor structure, that of the second embodiment is shown in FIG. 20. However, features of the fifth embodiment can be applied to the first, third and fourth embodiments.

By employing the structures and the manufacturing methods of the foregoing embodiments, it is possible to achieve high integration of the memory cells because there is no need to consider an alignment margin, and to simultaneously reduce contact resistance by increasing the contact area between the lower electrode and the contact plug immediately below.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a semiconductor substrate;
    a MOS transistor formed on the semiconductor substrate and including a pair of impurity regions as a source and a drain, and a gate electrode;
    a first monoblock conductive plug formed in contact with an upper surface of one of the pair of impurity regions and having a planar side face without a step from a side face upper end up to the semiconductor substrate; and
    a planar ferroelectric capacitor formed by stacking a lower electrode layer, a ferroelectric layer and an upper electrode layer on the first monoblock conductive plug, the side face upper end of the first monoblock conductive plug being aligned with side faces of the lower electrode layer, the ferroelectric layer and the upper electrode layer of the ferroelectric capacitor formed on the first monoblock conductive plug.

2. The semiconductor memory device according to claim 1, wherein the first monoblock conductive plug is formed insulatively and adjacently to the gate electrode, and the ferroelectric capacitor formed on the first monoblock conductive plug has a portion formed on the gate electrode to be insulated therefrom.

3. The semiconductor memory device according to claim 1, further comprising a plate line connected to the upper electrode of the ferroelectric capacitor,
    wherein the plate line is formed to be in direct contact with the upper electrode.

4. The semiconductor memory device according to claim 1, further comprising a sidewall insulating film formed in a sidewall part of the plate line.

5. The semiconductor memory device according to claim 1, further comprising:
    an interlayer insulating film formed on the semiconductor substrate to bury the MOS transistor and the ferroelectric capacitor;
    a bit line formed on the interlayer insulating film to be connected to one of the pair of impurity regions; and
    connecting portions of a plurality of second conductive plugs each connecting the bit line to one of the pair of impurity regions.

6. The semiconductor memory device according to claim 5, wherein one of the plurality of second conductive plugs directly connected to one of the pair of impurity regions is formed higher than an upper part of the ferroelectric capacitor.

7. The semiconductor memory device according to claim 5, further comprising an oxidation preventive film formed higher than the upper electrode of the capacitor.

8. The semiconductor memory device according to claim 1, further comprising a protective insulating film formed to cover a gate electrode and surroundings thereof,
    wherein the first monoblock conductive plug connects the lower electrode of the ferroelectric capacitor to one of the impurity regions through a portion in which a part of the protective insulating film is removed.

9. The semiconductor memory device according to claim 1, further comprising at least a single layer reaction preventive film formed to continuously cover the side faces of the ferroelectric capacitor and the first monoblock conductive plug, wherein the reaction preventive film has at least one of an oxygen barrier property and a hydrogen barrier property.

10. The semiconductor memory device according to claim 1, wherein a silicon and metal compound layer is formed on the pair of impurity regions and an upper surface of the gate electrode.

* * * * *